United States Patent
Jeon et al.

(10) Patent No.: US 8,330,155 B2
(45) Date of Patent: Dec. 11, 2012

(54) SEMICONDUCTOR DEVICES HAVING CHANNEL LAYER PATTERNS ON A GATE INSULATION LAYER

(75) Inventors: Sang-Hun Jeon, Yongin-si (KR); Moon-Sook Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 464 days.

(21) Appl. No.: 12/608,130

(22) Filed: Oct. 29, 2009

(65) Prior Publication Data

US 2010/0123128 A1 May 20, 2010

(30) Foreign Application Priority Data

Nov. 14, 2008 (KR) .................. 10-2008-0113392

(51) Int. Cl.
*H01L 29/786* (2006.01)
(52) U.S. Cl. .............. 257/43; 257/152; 257/E29.296
(58) Field of Classification Search .......... 257/43, 257/56, 288, E29.294–E29.297
See application file for complete search history.

(56) References Cited

U.S. PATENT DOCUMENTS

| | | | | |
|---|---|---|---|---|
| 5,066,993 A * | 11/1991 | Miura et al. | ................ | 257/347 |
| 5,793,072 A * | 8/1998 | Kuo | ................ | 257/241 |
| 7,385,264 B2 * | 6/2008 | Muraoka | ................ | 257/410 |
| 2003/0038288 A1 * | 2/2003 | Suzuki et al. | ................ | 257/72 |
| 2008/0277663 A1 * | 11/2008 | Kang et al. | ................ | 257/57 |
| 2010/0006834 A1 * | 1/2010 | Kim et al. | ................ | 257/43 |
| 2011/0049530 A1 * | 3/2011 | Dhar et al. | ................ | 257/77 |

FOREIGN PATENT DOCUMENTS

| | | |
|---|---|---|
| JP | 58-157169 | 9/1983 |
| KR | 1020040033006 A | 4/2004 |
| KR | 1020060004819 | 1/2006 |
| KR | 10-0792407 | 1/2008 |

* cited by examiner

*Primary Examiner* — Zandra Smith
*Assistant Examiner* — Paul Patton
(74) *Attorney, Agent, or Firm* — Myers Bigel Sibley & Sajovec

(57) ABSTRACT

Semiconductor devices include a gate electrode, a gate insulation layer, a first channel layer pattern, a second channel layer pattern and first and second metallic patterns. The gate electrode is on a substrate. The gate insulation layer is on the gate electrode. The first channel layer pattern is on the gate insulation layer, and has a first conductivity level. The second channel layer pattern is on the first channel layer pattern, and has a second conductivity level that is lower than the first conductivity level. The first and second metallic patterns are on the gate insulation layer and contact respective sidewalls of the first and second channel layer patterns.

15 Claims, 7 Drawing Sheets

US 8,330,155 B2

SEMICONDUCTOR DEVICES HAVING CHANNEL LAYER PATTERNS ON A GATE INSULATION LAYER

CLAIM OF PRIORITY

This application claims priority under 35 U.S.C. §119 from Korean Patent Application No. 10-2008-0113392, filed in the Korean Intellectual Property Office on Nov. 14, 2008, the disclosure of which is hereby incorporated by reference herein as if set forth in its entirety.

FIELD

Example embodiments relate to semiconductor devices and methods of manufacturing such devices. More particularly, example embodiments relate to semiconductor devices that include channel layer patterns and methods of manufacturing such semiconductor devices.

BACKGROUND

Chips used in radio frequency identifications (RFIDs), electronic article surveillance (EAS) tags, EAS sensors, etc. are generally manufactured by a low cost printing process.

Channel layers that are formed by a printing process include organic semiconductor layers. However, organic semiconductor materials may have low charge mobility and, consequently, it may be difficult to manufacture a high quality transistor using organic semiconductor materials. Thus, transistors having channel layers that include semiconductor oxides have been developed because semiconductor oxides may have high charge mobility.

A channel layer made from a semiconductor oxide generally has one conductivity type because a semiconductor oxide layer that has more than one conductivity type may be unstable. Additionally, forming a channel layer that has two conductivity types using a semiconductor oxide may require an expensive apparatus and/or a complicated manufacturing process. Thus, it may be difficult to manufacture a transistor that has a channel region and a source/drain region which have different conductivity types using a semiconductor oxide.

Accordingly, a source/drain region in a transistor having a semiconductor oxide channel layer may be formed using a metal. The transistor may be a majority carrier device in which a channel layer and charge carriers have the same conductive type. The majority carrier transistor may be mainly operated in an accumulation mode.

A minority carrier transistor may use an inversion layer that serves as a channel layer. This inversion layer may be very thin, e.g., about 3 nm. In contrast, the majority carrier transistor may use fully a three-dimensional volume layer as the channel layer.

In the majority carrier transistor, a carrier flow may be generated not only at a portion of the channel layer adjacent to a gate insulation layer but also at a portion of the channel layer adjacent a passivation layer that protects the channel layer. The passivation layer may include positive fixed charges, which have substantially the same effect as impurities that are doped in the channel layer. Thus, the carrier flow may be increased at the portion of the channel layer that is adjacent the passivation layer, which may deteriorate the ability to control carriers using a gate electrode.

SUMMARY

Pursuant to example embodiments of the present inventive concept, semiconductor devices that include a transistor are provided, wherein a gate electrode of the transistor may have an enhanced capability to control carriers.

Pursuant to further example embodiments of the present inventive concept, methods of manufacturing semiconductor device that include a transistor are provided, where a gate electrode of the transistor may have an enhanced capability to control carriers.

Pursuant to some example embodiments, semiconductor devices are provided that include a gate electrode, a gate insulation layer, a first channel layer pattern, a second channel layer pattern and metallic patterns. The gate electrode is on a substrate. The gate insulation layer is on the gate electrode. The first channel layer pattern is on the gate insulation layer, and has a first conductivity level. The second channel layer pattern is on the first channel layer pattern, and has a second conductivity level that is lower than the first conductivity level. The metallic patterns are on the gate insulation layer and contact respective sidewalls of the first and second channel layer patterns.

In some embodiments, the gate insulation layer is between the gate electrode and the first channel layer pattern, and the first channel layer pattern is between the gate insulation layer and the second channel layer pattern. Moreover, the first and second channel layer patterns may each comprise a semiconductor oxide and/or a metal oxide. In some embodiments, the first and second channel layer patterns may comprise substantially the same material, and the second channel layer pattern may have a charge concentration that is lower than a charge concentration of the first channel layer pattern. Additionally, in some embodiments, the first channel layer pattern may have an oxygen vacancy that is larger than an oxygen vacancy of the second channel layer pattern, and the first channel layer pattern may have a defect density that is higher than a defect density of the second channel layer pattern.

In some embodiments, the semiconductor device may have a passivation layer that is directly on the channel layer pattern. This passivation layer may include a halogen element.

According to further example embodiments, methods of manufacturing semiconductor devices are provided in which a gate electrode is formed on a substrate. A gate insulation layer is formed on the substrate and on the gate electrode. A first channel layer pattern having a first conductivity level is formed on the gate insulation layer such that the gate insulation layer is between the gate electrode and the first channel layer pattern. A second channel layer pattern having a second conductivity level that is lower than the first conductivity level is formed on the first channel layer pattern. First and second metallic patterns are formed on the gate insulation layer to contact respective first and second sidewalls of the first channel layer pattern and to contact respective first and second sidewalls of the second channel layer pattern.

In some embodiments, forming the first and second channel layer patterns comprises forming a channel layer pattern that comprises a semiconductor oxide and/or a metal oxide, wherein a portion of the channel layer pattern that is adjacent the gate insulation layer comprises the first channel layer pattern and a portion of the channel layer pattern that is opposite the gate insulation comprises the second channel layer pattern, and then performing a plasma oxidation process on the second channel layer pattern so that the second channel layer pattern has a charge concentration that is lower than a charge concentration of the first channel layer pattern.

In some embodiments, the method further includes forming a passivation layer directly on the second channel layer pattern. This passivation layer may include a halogen element.

According to still further example embodiments, semiconductor devices are provided that include a gate electrode, a gate insulation layer, a channel layer pattern, first and second metallic patterns and an insulation layer. The gate electrode is on a substrate. The gate insulation layer is on the gate electrode. The channel layer pattern is on the gate insulation layer opposite the substrate. The first and second metallic patterns are formed on the gate insulation layer and contact respective first and second sidewalls of the channel layer pattern. The insulation layer is directly on a surface of the channel layer pattern that is opposite the gate insulation layer, and includes a negative fixed oxide charge.

In some embodiments, the insulation layer may include aluminum oxide, hafnium oxide, zirconium oxide or lanthanum oxide. These may be used alone or in combination thereof.

BRIEF DESCRIPTION OF THE DRAWINGS

Certain example embodiments will be more clearly understood from the following detailed description taken in conjunction with the accompanying drawings.

DETAILED DESCRIPTION

Figure 1:
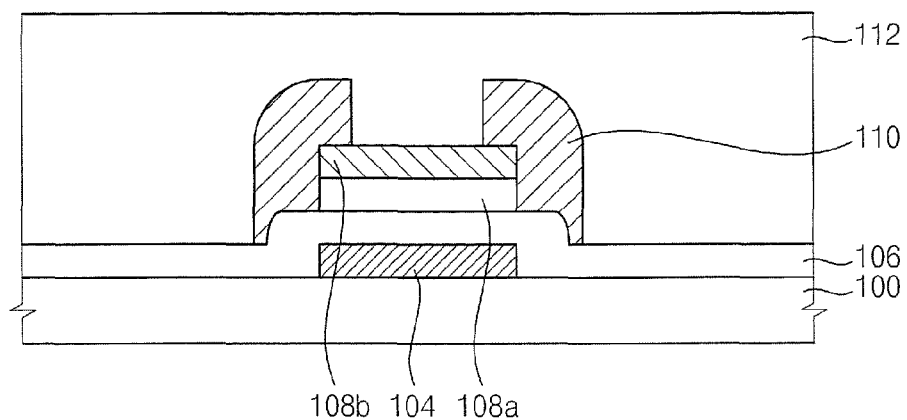
FIG. 1 is a cross-sectional view illustrating a transistor in accordance with some embodiments.

Various embodiments of the present inventive concept will be described more fully hereinafter with reference to the accompanying drawings. The present inventive concept may, however, be embodied in many different forms and should not be construed as limited to the embodiments set forth herein. Rather, these embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, operations, elements, and/or components, but do not preclude the presence or addition of one or more other features, operations, elements, components, and/or groups thereof.

Certain embodiments are described herein with reference to cross-sectional illustrations that are schematic illustrations. As such, variations from the shapes of the illustrations as a result, for example, of manufacturing techniques and/or tolerances, are to be expected. Thus, the pictured embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, various embodiments of the present inventive concept will be explained in detail with reference to the accompanying drawings.

FIG. 1 is a cross-sectional view illustrating a transistor in accordance with certain example embodiments.

Referring to FIG. 1, a gate electrode 104 may be formed on a substrate 100. The substrate 100 may comprise a semiconductor substrate such as a silicon substrate, or an insulation substrate such as a plastic substrate. In embodiments that include an at least partially insulating substrate, the gate electrode 104 may be formed on an insulating portion of the substrate 100. In some embodiments (particularly embodiments that include a semiconductor substrate), an insulation layer (not shown in FIG. 1) may be provided between the gate electrode 104 and the substrate 100.

A gate insulation layer 106 may be formed on the substrate 100 to cover the gate electrode 104. The gate insulation layer 106 may include an organic material, an inorganic material, or a hybrid material.

A first channel layer pattern 108a having a first conductivity level may be formed on the gate insulation layer 106. The first channel layer pattern 108a may comprise a semiconductor oxide and/or a metal oxide. The first channel layer pattern 108a may comprise, for example, zinc oxide, vanadium oxide, nickel oxide, etc., or an oxide of a semiconductor such as gallium nitride, silicon, silicon germanium, cadmium sulfide, carbon, gallium arsenide, silicon carbide, zinc sulfide, zinc selenide, zinc telluride, cadmium sulfide, cadmium selenide, cadmium telluride, mercury selenide, mercury telluride, copper aluminum selenide, aluminum indium phosphorus, aluminum gallium arsenide, aluminum indium arsenide, aluminum gallium stibium, aluminum indium stibium, gallium indium phosphorus, gallium indium stibium, gallium phosphorus arsenide, gallium arsenide stibium, indium phosphorus arsenide, indium arsenide stibium, etc. The first channel layer pattern 108a may have nanowires or nano-particles.

A second channel layer pattern 108b having a second conductivity level that is lower than the first conductivity level may be formed on the first channel layer pattern 108a. That is, the second channel layer pattern 108b may have a carrier concentration that is lower than a carrier concentration of the first channel layer pattern 108a. The second channel layer pattern 108b may have a defect density that is lower than a defect density of the first channel layer pattern 108a. Additionally, the second channel layer pattern 108b may have an oxygen vacancy that is smaller than an oxygen vacancy of the first channel layer pattern 108a.

The first and second channel layer patterns 108a and 108b may be formed of substantially the same material.

In some embodiments, the first and second channel layer patterns 108a and 108b may each have relatively constant charge concentrations. In such embodiments, the first channel layer pattern 108a may have a charge concentration that is different from a charge concentration of the second channel layer pattern 108b. In particular, the first channel layer pattern 108a may have a first charge concentration, and the second channel layer pattern 108b may have a second charge concentration that is lower than the first charge concentration.

In other embodiments, each of the first and second channel layer patterns 108a and 108b may have a charge concentration that varies with, for example, the distance from the gate insulation layer 106. For example, in some embodiments, the first and second charge concentrations may decrease with increasing distance from the gate insulation layer 106.

In still other embodiments, the first and second channel layer patterns 108a and 108b may comprise different materials.

First metallic patterns 110 may be formed on the gate insulation layer 106 to contact sidewalls of the first and second channel layer patterns 108a and 108b. The first metallic patterns 110 may not be electrically connected to the gate electrode 104. The first metallic patterns 110 may serve as source/drain regions of the transistor.

A passivation layer 112 may be formed on the substrate 100. The passivation layer may cover the metallic patterns 110, the second channel layer pattern 108b and the gate insulation layer 106. The passivation layer 112 may comprise, for example, silicon oxide.

The passivation layer 112 may be doped with halogen elements. When halogen elements having a high electronegativity are doped in the passivation layer 112, the passivation layer 112 may have increased negative fixed charges. Thus, undesired carriers may be prevented from being induced to a portion of the second channel layer pattern 108b adjacent to the passivation layer 112.

The transistor of FIG. 1 may have a good switching control by the gate electrode 104 because the second channel layer pattern 108b has a low conductivity. Additionally, the transistor may have a reduced drain induced barrier lowering (DIBL), and the subthreshold slope thereof may be improved.

Hereinafter, the relationship between the conductivities of the first and second channel layer patterns 108a and 108b and the switching control by the gate electrode 104 is explained. The first and second channel layer patterns 108a and 108b may include a semiconductor oxide having either an n-type conductivity or a p-type conductivity. In the present embodiment, the first and second channel layer patterns 108a and 108b comprise n-type zinc oxide patterns, and the passivation layer 112 comprises a silicon oxide pattern.

Figure 2:
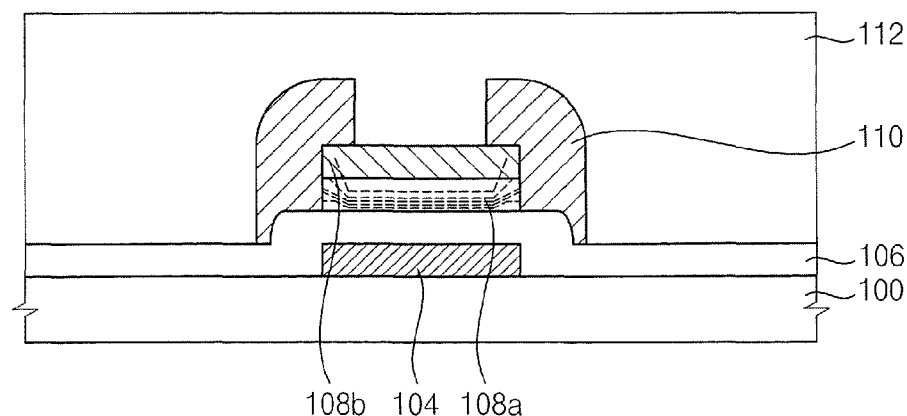
FIG. 2 is a cross-sectional view illustrating a carrier flow through the transistor of FIG. 1 when the transistor is in its on-state.
Figure 3:
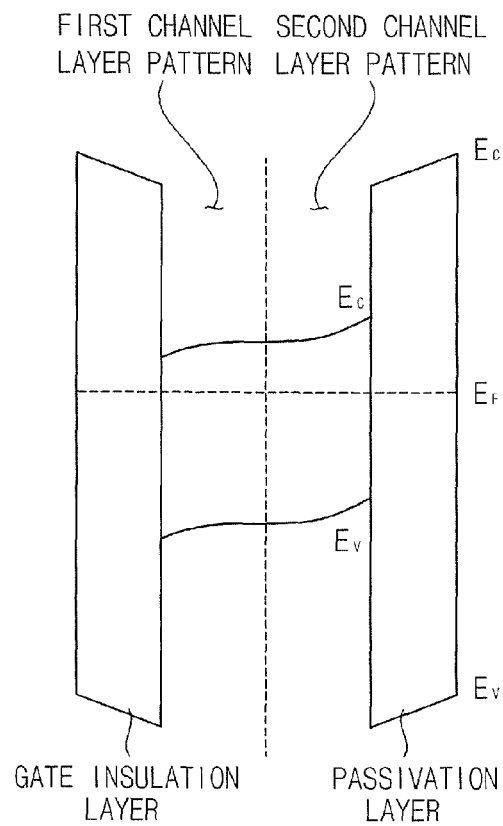
FIG. 3 is an energy band diagram of the transistor of FIG. 1.

FIG. 2 is a cross-sectional view illustrating a carrier flow of the transistor of FIG. 1 when the transistor is in its "on-state" (i.e., when the transistor is conducting current through the channel thereof in response to application of a threshold voltage to the gate electrode). FIG. 3 is an energy band diagram of the transistor of FIG. 1.

Referring to FIGS. 2 and 3, the second channel layer pattern 108b may have a charge concentration that is lower than a charge concentration of the first channel layer pattern 108a. As shown in FIG. 3, as a result, the conduction band $E_C$ may be bent so that the energy gap between the conduction band $E_C$ and the Fermi level $E_F$ may be increased in the second channel layer pattern 108b, particularly at a portion of the second channel layer pattern 108b that is adjacent the passivation layer 112. When the passivation layer 112 is doped with halogen elements, the passivation layer may have increased negative fixed charges, thereby further increasing the energy gap between the conduction band $E_C$ and the Fermi level $E_F$.

As illustrated above, the energy gap between the conduction band $E_C$ and the Fermi level $E_F$ at the portion of the second channel layer pattern 108b adjacent the passivation layer 112 may be increased, which may thereby reduce the number of charge carriers that are induced therein. Thus, the charge carriers may be mainly induced in the first channel layer pattern 108a, which is adjacent the gate electrode 104. Accordingly, the transistor may have the improved switching control by the gate electrode 104.

Figure 4:
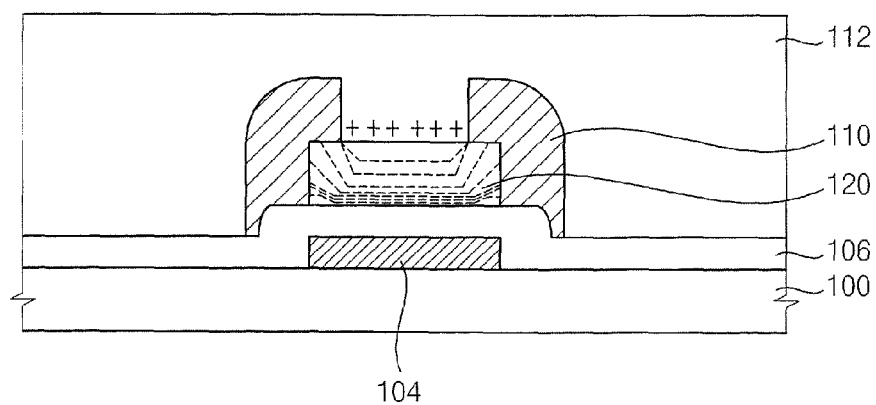
FIG. 4 is a cross-sectional view illustrating a carrier flow through a transistor that only includes a single channel layer pattern.
Figure 5:
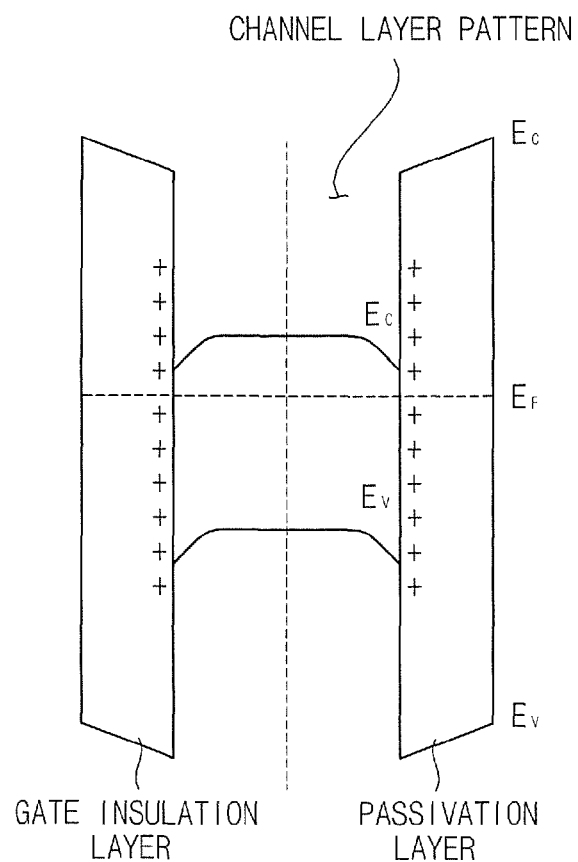
FIG. 5 is an energy band diagram of the transistor of FIG. 4.

FIG. 4 is a cross-sectional view illustrating a carrier flow through a transistor that only includes a single channel layer pattern 120 instead of the first and second channel layer patterns 108a and 108b of the transistor of FIGS. 1-2. FIG. 5 is an energy band diagram of the transistor of FIG. 4.

Referring to FIGS. 4 and 5, it can be seen that the carrier flow is relatively strong at a portion of the channel layer pattern 120 that is adjacent the gate electrode 104. However, the carrier flow is also generated at a portion of the channel layer pattern 120 that is adjacent the passivation layer 112.

In particular, in the transistor of FIG. 4, positive charges may be generated at a portion of the passivation layer 112 that is adjacent the channel layer pattern 120, so that the conduction band $E_C$ may be bent to decrease the energy gap between the conduction band $E_C$ and the Fermi level $E_F$ at the portion of the channel layer pattern 120 that is adjacent the passivation layer 112 (see FIG. 5). Thus, the charge concentration at the portion of the channel layer pattern 120 that is adjacent the passivation layer 112 may be increased, and charges may be induced thereto. Accordingly, the carrier flow may be generated at both the portion of the channel layer pattern 120 that is adjacent the gate electrode 104 and at the portion of the channel layer pattern 120 that is adjacent the passivation layer 112.

FIGS. 6 to 9 are cross-sectional views illustrating a method of manufacturing the transistor of FIG. 1.

Figure 6:
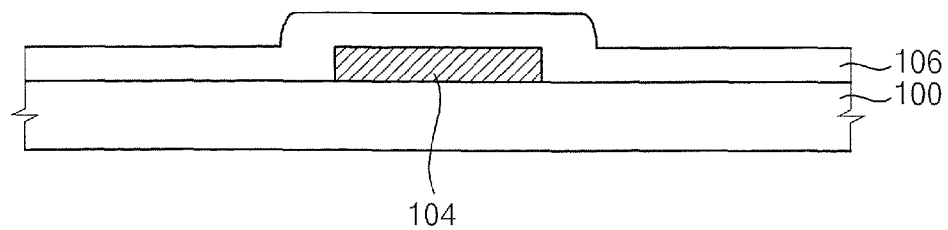
FIGS. 6 to 9 are cross-sectional views illustrating a method of manufacturing the transistor of FIG. 1.

Referring to FIG. 6, the gate electrode 104 may be formed on the substrate 100. The gate electrode 104 may be formed, for example, by a printing process.

In some embodiments, the gate electrode 104 may be formed by coating a gate electrode material on a first mold (not shown). The first mold may have a protrusion that corresponds to a first portion of the substrate 100 on which the gate electrode 104 may be formed. The first mold may be pressed onto the substrate 100, and thus the gate electrode material may be transferred from the protrusion of the first mold to the substrate 100. As a result, the gate electrode 104 may be formed on the substrate 100.

The gate insulation layer 106 may be formed on the substrate 100 on the gate electrode 104. In some embodiments, the gate insulation layer 106 may cover the gate electrode 104. The gate insulation layer 106 may be formed, for example, by a deposition process or a spin coating process. The gate insulation layer 106 may be formed using an organic material, an inorganic material, or a hybrid material. For example, in some embodiments the gate insulation layer 106 may be formed using silicon oxide.

Figure 7:
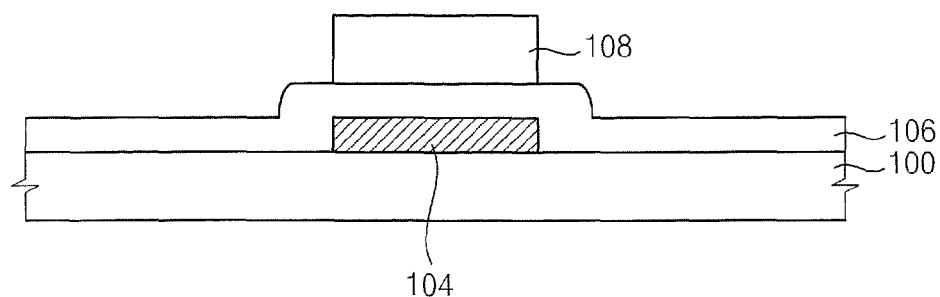

Referring to FIG. 7, a preliminary channel layer pattern 108 may be formed on the gate insulation layer 106. The preliminary channel layer pattern 108 may be formed, for example, by a printing process. The preliminary channel layer pattern 108 may comprise a semiconductor oxide and/or a metal oxide. For example, the preliminary channel layer pattern 108 may comprise zinc oxide, vanadium oxide, nickel oxide, etc., or an oxide of a semiconductor such as gallium nitride, silicon, silicon germanium, cadmium sulfide, carbon, gallium arsenide, silicon carbide, zinc sulfide, zinc selenide, zinc telluride, cadmium sulfide, cadmium selenide, cadmium telluride, mercury selenide, mercury telluride, copper aluminum selenide, aluminum indium phosphorus, aluminum gallium arsenide, aluminum indium arsenide, aluminum gallium stibium, aluminum indium stibium, gallium indium phosphorus, gallium indium stibium, gallium phosphorus arsenide, gallium arsenide stibium, indium phosphorus arsenide, indium arsenide stibium, etc. The preliminary channel layer pattern 108 may include nanowires or nano-particles.

Figure 8:
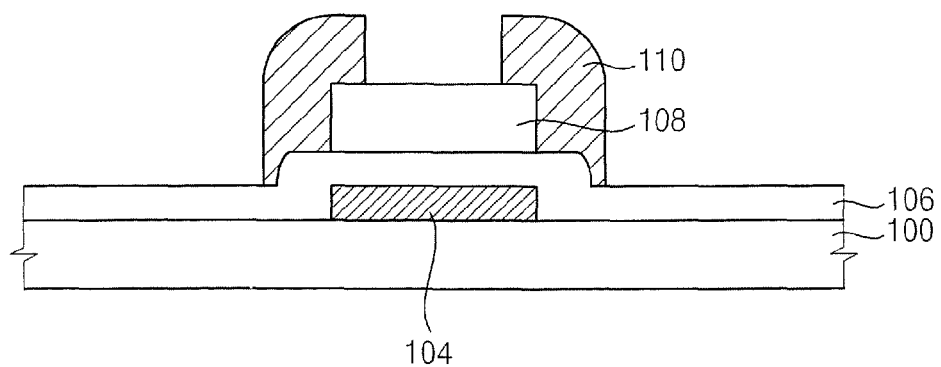

Referring to FIG. 8, metallic patterns 110 may be formed on the gate insulation layer 106 to contact sidewalls and, in some embodiments, a top surface, of the preliminary channel layer pattern 108. The metallic patterns 110 may be formed, for example, by a printing process. The metallic patterns 110 may serve as the source/drain regions of the transistor.

Figure 9:
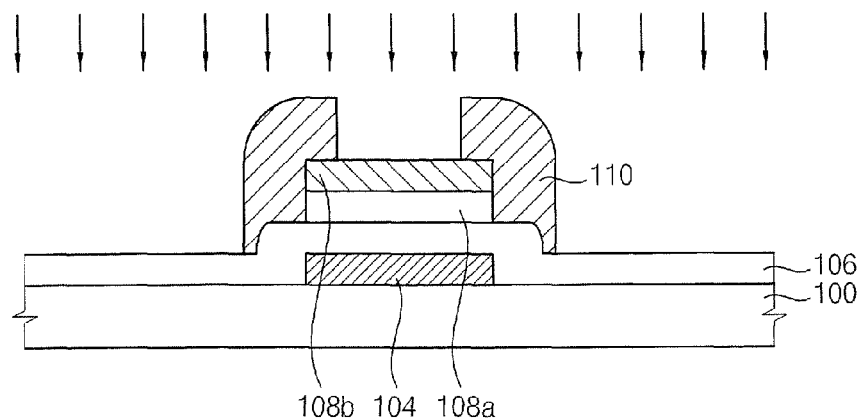

Referring to FIG. 9, an upper portion of the preliminary channel layer pattern 108 may be treated to change the preliminary channel layer pattern 108 into the first and second channel layer patterns 108a and 108b. That is, the upper portion of the preliminary channel layer pattern 108 may be changed into a second channel layer pattern 108b that is on the first channel layer pattern 108a by the treatment. The second channel layer pattern 108b may have a charge concentration that is lower than the charge concentration of the first channel layer pattern 108a.

By way of example, in some embodiments, a plasma oxidation process may be performed on the top surface of the preliminary channel layer pattern 108 to convert the upper portion of the preliminary channel layer pattern 108 into the second channel layer pattern 108b. In other embodiments, a chemical oxidation process may be performed on the top surface of the preliminary channel layer pattern 108 to convert the upper portion of the preliminary channel layer pattern 108 into the second channel layer pattern 108b. In still other embodiments, oxygen ions may be implanted into the upper portion of the preliminary channel layer pattern 108 to convert it into the second channel layer pattern 108b.

The second channel layer pattern 108b may have less room for oxygen than the first channel layer pattern 108a and may have a lower defect density than the first channel layer pattern 108a. Thus, the first channel layer pattern 108a may have a higher carrier concentration that that of the second channel layer pattern 108b.

In further embodiments, the surface treatment may be performed on the preliminary channel layer pattern 108 so that the preliminary channel layer pattern 108 may have a conductivity that decreases with increasing distance from the gate insulation layer 106.

The passivation layer 112 may be formed on the substrate 100 to cover the metallic pattern 110, the second channel layer pattern 108b and the gate insulation layer 106, as shown in FIG. 1. The passivation layer 112 may directly contact the second channel layer pattern 108b that has the relatively low conductivity (i.e., as compared to the first channel layer pattern 108a).

Halogen elements may be implanted into the passivation layer 112. The halogen elements may include fluorine, chlorine, bromine, iodine, etc. These halogen may be implanted into the passivation layer 112 alone or in combination thereof. The implantation may be performed by, for example, a plasma doping process, a gas vapor deposition process, a melting process, etc.

The implantation of the halogen elements into the passivation layer 112 may decrease the induction of carriers into the portion of the second channel layer pattern 108b that is adjacent to the passivation layer 112.

Figure 10:
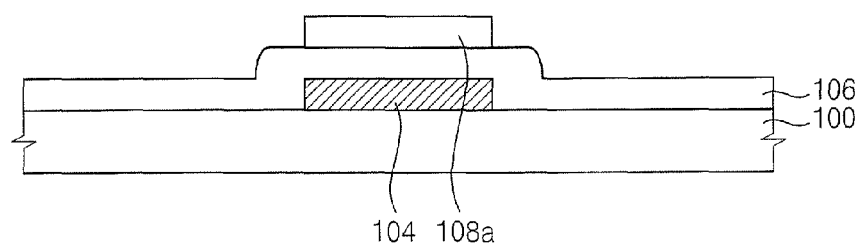
FIGS. 10 and 11 are cross-sectional views illustrating another method of manufacturing the transistor of FIG. 1.
Figure 11:
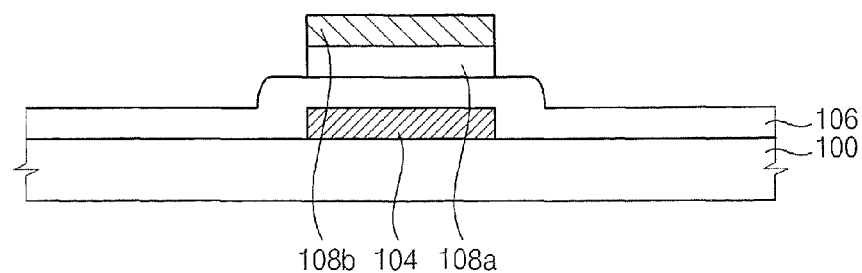

FIGS. 10 and 11 are cross-sectional views illustrating another method of manufacturing the transistor of FIG. 1.

Referring to FIG. 10, the gate electrode 104 may be faulted on the substrate 100. The gate electrode 104 may be formed by a printing process. The gate insulation layer 106 may be formed on the substrate 100 to cover the gate electrode 104.

A first channel layer pattern 108a that has a first conductivity may be formed on the gate insulation layer 106. The first channel layer pattern 108a may be formed by a printing process. The first channel layer pattern 108a may comprise a semiconductor oxide and/or a metal oxide. For example, the first channel layer pattern 108a may comprise zinc oxide, vanadium oxide, nickel oxide, etc., or an oxide of a semiconductor such as gallium nitride, silicon, silicon germanium, cadmium sulfide, carbon, gallium arsenide, silicon carbide, zinc sulfide, zinc selenide, zinc telluride, cadmium sulfide, cadmium selenide, cadmium telluride, mercury selenide, mercury telluride, copper aluminum selenide, aluminum indium phosphorus, aluminum gallium arsenide, aluminum indium arsenide, aluminum gallium stibium, aluminum indium stibium, gallium indium phosphorus, gallium indium stibium, gallium phosphorus arsenide, gallium arsenide stibium, indium phosphorus arsenide, indium arsenide stibium, etc. The first channel layer pattern 108a may include nanowires or nano-particles.

Referring to FIG. 11, the second channel layer pattern 108b that has a second conductivity that is lower than the first conductivity may be formed on the first channel layer pattern 108a. That is, the second channel layer pattern 108b may have a carrier concentration that is lower than a carrier charge concentration of the first channel layer pattern 108a.

As shown in FIG. 1, the metallic patterns 110 may be formed on the gate insulation layer 106 to contact the sidewalls of the first and second channel layer patterns 108a and 108b. The metallic patterns 110 may be formed, for example, by a printing process. The metallic patterns 110 may serve as the source/drain regions of the transistor.

The passivation layer 112 may be formed on the substrate 100 to cover the metallic pattern 110, the second channel layer pattern 108b and the gate insulation layer 106, as shown in FIG. 1. Halogen elements may be implanted into the passivation layer 112.

Figure 12:
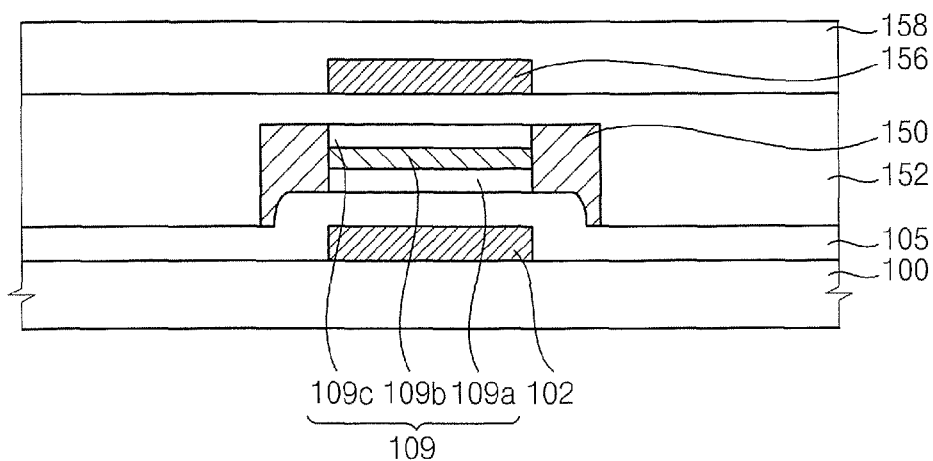
FIG. 12 is a cross-sectional view illustrating a transistor according to further embodiments.

FIG. 12 is a cross-sectional view illustrating a transistor in according to example embodiments.

Referring to FIG. 12, a first gate electrode 102 may be formed on the substrate 100. A first gate insulation layer 105 may be formed on the substrate 100 to cover the first gate electrode 102. The first gate insulation layer 105 may include an organic material, an inorganic material, or a hybrid material.

A channel layer structure 109 may be formed on the first gate insulation layer 105. The channel layer structure 109 may include a semiconductor oxide and/or a metal oxide. For example, the channel layer structure 109 may include comprise zinc oxide, vanadium oxide, nickel oxide, etc., or an oxide of a semiconductor such as gallium nitride, silicon, silicon germanium, cadmium sulfide, carbon, gallium arsenide, silicon carbide, zinc sulfide, zinc selenide, zinc telluride, cadmium sulfide, cadmium selenide, cadmium telluride, mercury selenide, mercury telluride, copper aluminum selenide, aluminum indium phosphorus, aluminum gallium arsenide, aluminum indium arsenide, aluminum gallium stibium, aluminum indium stibium, gallium indium phosphorus, gallium indium stibium, gallium phosphorus arsenide, gallium arsenide stibium, indium phosphorus arsenide, indium arsenide stibium, etc. The channel layer structure 109 may include nanowires or nano-particles.

Metallic patterns 150 may be formed on the first gate insulation layer 105 to contact sidewalls of the channel layer structure 109. The metallic patterns 150 may be electrically insulated from the first gate electrode 102. The metallic patterns 150 may serve as source/drain regions of the transistor.

A second gate insulation layer 152 may be formed on the first gate insulation layer 105 to cover the metallic patterns 150 and the channel layer structure 109.

A second gate electrode 156 may be formed on the second gate insulation layer 152. The second gate electrode 156 may overlap the channel layer structure 109. The second gate electrode 156 may be electrically insulated from the metallic patterns 150.

A passivation layer 158 may be formed on the second gate insulation layer 152. The passivation layer 158 may cover the second gate electrode 156. The passivation layer 158 may include silicon oxide. The passivation layer 158 may be doped with halogen elements.

The channel layer structure 109 may, in some embodiments, have a conductivity that decreases with increasing distance from the closer of the first and second gate insulation layers 105 and 152. For example, in the pictured embodiment, the channel layer structure 109 may have a multi-layered structure in which different material layers are stacked. In other embodiments, the channel layer structure 109 may include the same material regardless of the distance from the first and second gate insulation layers 105 and 152.

In some embodiments, the channel layer structure 109 may have a first channel layer pattern 109a having a first conductivity, a second channel layer pattern 109b having a second conductivity that is lower than the first conductivity, and a third channel layer pattern 109c having a third conductivity that is higher than the second conductivity (and which may, in some embodiments, be the same as the first conductivity).

In certain embodiments, the first, second and third channel layer patterns 109a, 109b and 109c may comprise the same material, and may have first, second and third charge concentrations, respectively. The first and third charge concentrations may be higher than the second charge concentration.

In other embodiments, the first, second and third channel layer patterns 109a, 109b and 109c may include the same material, each of which may have a charge concentration that varies with increasing distance from the first and second gate insulation layers 105 and 152. In particular, the charge concentration in each layer may decrease with increasing distance from the closer of the first and second gate insulation layers 105 and 152.

In still other embodiments, the first and third channel layer patterns 109a and 109c may comprise a first material, and the second channel layer pattern 109b may comprise a second material that is different from the first material and that has a carrier concentration that is lower than a carrier concentration of the first and third channel layer patterns 109a and 109c.

The transistor may have an improved switching control by the gate electrode 102 because a central portion of the channel layer structure 109 that is distant from the first and second gate insulation layers 105 and 152 has a relatively low conductivity.

Figure 13:
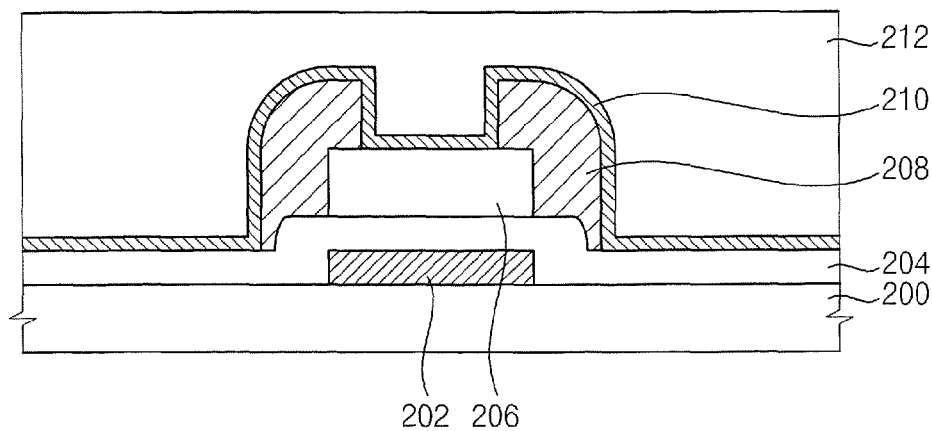
FIG. 13 is a cross-sectional view illustrating a transistor according to still further embodiments.

FIG. 13 is a cross-sectional view illustrating a transistor according to still further example embodiments.

Referring to FIG. 13, a gate electrode 202 may be formed on a substrate 200. A gate insulation layer 204 may be formed on the substrate 200 to cover the gate electrode 202. The gate insulation layer 204 may include an organic material, an inorganic material, or a hybrid material.

A channel layer pattern 206 may be foamed on the gate insulation layer 204. The channel layer pattern 206 may include a semiconductor oxide and/or a metal oxide. For example, the channel layer pattern 206 may comprise zinc oxide, vanadium oxide, nickel oxide, etc., or an oxide of a semiconductor such as gallium nitride, silicon, silicon germanium, cadmium sulfide, carbon, gallium arsenide, silicon carbide, zinc sulfide, zinc selenide, zinc telluride, cadmium sulfide, cadmium selenide, cadmium telluride, mercury selenide, mercury telluride, copper aluminum selenide, aluminum indium phosphorus, aluminum gallium arsenide, aluminum indium arsenide, aluminum gallium stibium, aluminum indium stibium, gallium indium phosphorus, gallium indium stibium, gallium phosphorus arsenide, gallium arsenide stibium, indium phosphorus arsenide, indium arsenide stibium, etc. The channel layer pattern 206 may include nanowires or nano-particles.

Metallic patterns 208 may be formed on the gate insulation layer 204 to contact sidewalls of the channel layer pattern 206. The metallic patterns 208 may be electrically insulated from the gate electrode 202. The metallic patterns 208 may serve as source/drain regions of the transistor.

An insulation layer 210 may be formed on the gate insulation layer 204 to cover the metallic patterns 208 and the channel layer pattern 206.

A passivation layer 212 may be formed on the insulation layer 210. The passivation layer 212 may include silicon oxide.

The insulation layer 210 may include a negative fixed oxide charge. The insulation layer 210 may contact a top surface of the channel layer pattern 206. This top surface of the channel layer pattern 206 does not contact the gate insulation layer 204. For example, as shown in FIG. 13, the top surface of the channel layer pattern 206 may be opposite the gate insulation layer 204. The insulation layer 210 may discourage carriers from being induced in a portion of the channel layer pattern 206 that is adjacent the passivation layer 212. Thus, carrier flows may be mainly generated at a portion of the channel layer pattern 206 that is adjacent the gate electrode 202, and the transistor may have an improved switching control by the gate electrode 202.

The insulation layer 210 may comprise, for example, aluminum oxide, hafnium oxide, zirconium oxide, lanthanum oxide, etc. These may be used alone or in combination thereof.

Figure 14:
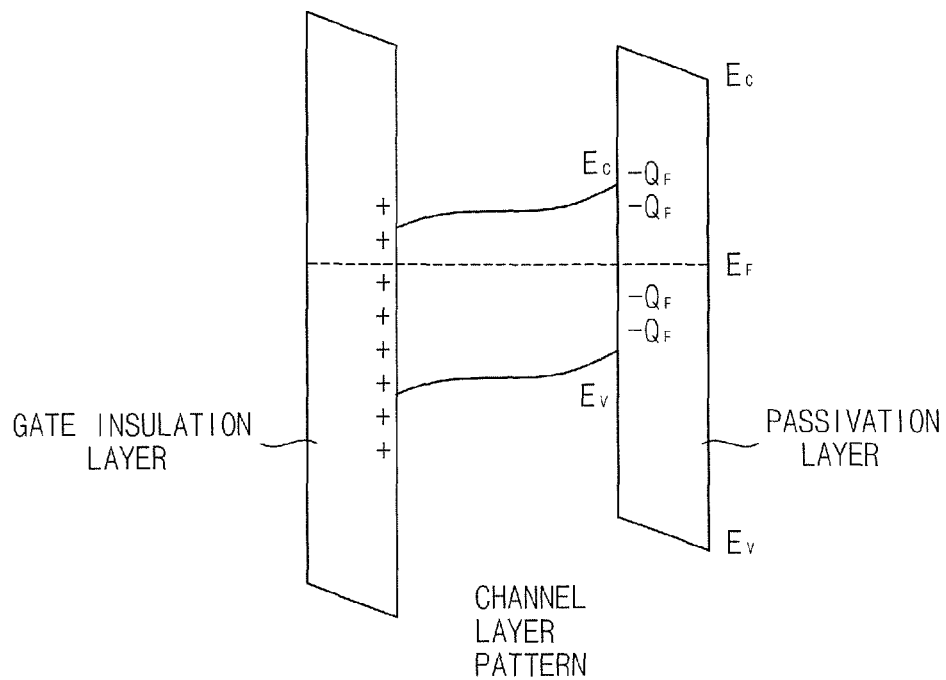
FIG. 14 is an energy band diagram of the transistor of FIG. 13.

FIG. 14 is an energy band diagram of the transistor of FIG. 13.

The transistor of FIG. 13 may have the insulation layer 210 including the negative fixed oxide charge on the channel layer pattern 206, and thus the passivation layer 212 may not directly contact the top surface of the channel layer pattern 206.

Referring to FIG. 14, the insulation layer 210 may have the negative fixed oxide charge, so that a portion of the insulation layer 210 contacting the channel layer pattern 206 may be electrified with negative charges. Thus, the conduction band $E_C$ may be bent so that the energy gap between the conduction band $E_C$ and the Fermi level $E_F$ may be increased in the portion of the channel layer pattern 206 that contacts the insulation layer 210. Thus, the charge concentration at the portion of the channel layer pattern 206 contacting the insulation layer 210 may be decreased, and charges may not be induced thereto. Accordingly, the carrier flow may be mainly generated in the portion of the channel layer pattern 206 adjacent to the gate electrode 202, which means that the transistor may have an improved switching control by the gate electrode 202.

The transistor of FIG. 13 may be manufactured by forming a bottom gate structure and forming an insulation layer including a negative fixed oxide charge on the bottom gate structure.

Figure 15:
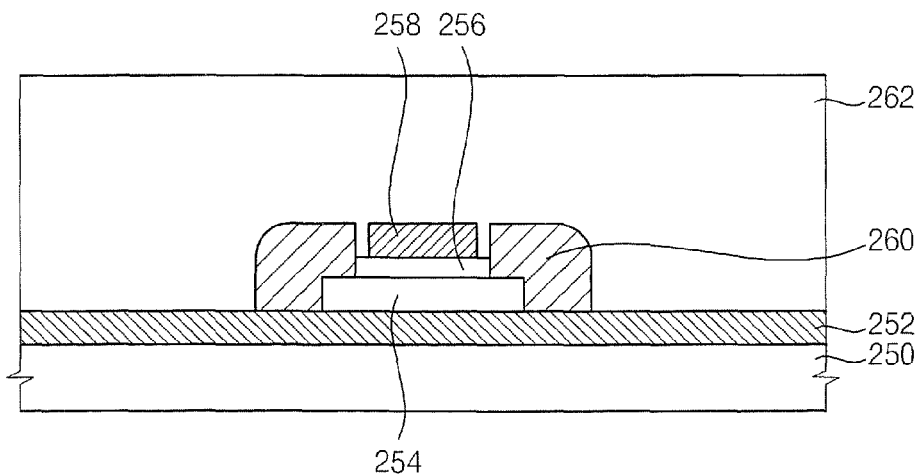
FIG. 15 is a cross-sectional view illustrating a transistor according to yet additional embodiments.

FIG. 15 is a cross-sectional view illustrating a transistor according to yet further example embodiments.

Referring to FIG. 15, an insulation layer 252 including a negative fixed oxide charge may be formed on a substrate 250. The insulation layer 252 may cover the entire substrate 250 or may partially cover the substrate 250.

The insulation layer 252 may comprise, for example, aluminum oxide, hafnium oxide, zirconium oxide, lanthanum oxide, etc. These may be used alone or in combination thereof.

A channel layer pattern 254 may be formed on the insulation layer 252. The channel layer pattern 254 may include a semiconductor oxide and/or a metal oxide. For example, the channel layer pattern 254 may comprise zinc oxide, vanadium oxide, nickel oxide, etc., or an oxide of a semiconductor such as gallium nitride, silicon, silicon germanium, cadmium sulfide, carbon, gallium arsenide, silicon carbide, zinc sulfide, zinc selenide, zinc telluride, cadmium sulfide, cadmium selenide, cadmium telluride, mercury selenide, mercury telluride, copper aluminum selenide, aluminum indium phosphorus, aluminum gallium arsenide, aluminum indium arsenide, aluminum gallium stibium, aluminum indium stibium, gallium indium phosphorus, gallium indium stibium, gallium phosphorus arsenide, gallium arsenide stibium, indium phosphorus arsenide, indium arsenide stibium, etc. The channel layer pattern 254 may include nanowires or nano-particles.

A gate insulation layer pattern 256 may be formed on the channel layer pattern 254. A gate electrode 258 may be formed on the gate insulation layer pattern 254.

Metallic patterns 260 may be formed on the insulation layer 252 to contact sidewalls of the channel layer pattern 254. The metallic patterns 260 may be electrically insulated from the gate electrode 258. The metallic patterns 260 may serve as source/drain regions of the transistor.

A passivation layer 262 may be fanned on the insulation layer 252 to cover the metallic patterns 260, the gate electrode 258 and the gate insulation layer pattern 256. The passivation layer 262 may include silicon oxide.

The insulation layer 252 may include the negative fixed oxide charge. The insulation layer 252 may contact a bottom surface of the channel layer pattern 254. The bottom surface of the channel layer pattern does not contact the gate insulation layer 256. Carriers may be discouraged from being induced to a portion of the channel layer pattern 254 adjacent the insulation layer 210. Thus, carrier flows may be mainly generated at a portion of the channel layer pattern 254 that is adjacent the gate electrode 258, and the transistor may have an improved switching control by the gate electrode 258.

The transistor of FIG. 15 may be manufactured by forming an insulation layer including a negative fixed oxide charge and forming a top gate structure on the insulation layer.

According to certain embodiments, transistors having a good switching control by a gate electrode may be manufactured at a low cost, and these transistors may be adapted to various chips used in RFIDs, EAS tags, EAS sensors, etc.

The foregoing is illustrative and is not to be construed as limiting thereof. Although a few embodiments have been described, those skilled in the art will readily appreciate that many modifications are possible in the described embodiments without materially departing from the novel teachings and advantages of the present inventive concept. Accordingly, all such modifications are intended to be included within the scope of the present inventive concept as defined in the claims.

What is claimed is:

1. A semiconductor device, comprising:
   a gate electrode on a substrate;
   a gate insulation layer on the gate electrode;
   a first channel layer pattern on the gate insulation layer, the first channel layer pattern having a first conductivity level;
   a second channel layer pattern on the first channel layer pattern, the second channel layer pattern having a second conductivity level that is lower than the first conductivity level; and
   first and second metallic patterns contacting respective first and second sidewalls of the first channel layer pattern and respective first and second sidewalls of the second channel layer pattern.

2. The semiconductor device of claim 1, wherein the gate insulation layer is between the gate electrode and the first channel layer pattern, and wherein the first channel layer pattern is between the gate insulation layer and the second channel layer pattern.

3. The semiconductor device of claim 2, wherein the first and second channel layer patterns each comprise a semiconductor oxide and/or a metal oxide.

4. The semiconductor device of claim 2, wherein the first and second channel layer patterns comprise substantially the same material, and the second channel layer pattern has a second charge concentration that is lower than a first charge concentration of the first channel layer pattern.

5. The semiconductor device of claim 1, wherein the first channel layer pattern has a first oxygen vacancy level that is larger than a second oxygen vacancy level of the second channel layer pattern and wherein the first channel layer pattern has a defect density that is higher than a defect density of the second channel layer pattern.

6. The semiconductor device of claim 2, further comprising a passivation layer that is directly on the second channel layer pattern.

7. The semiconductor device of claim 6, wherein the passivation layer includes a halogen element.

8. The semiconductor device of claim 2, further comprising a third channel layer pattern on the second channel layer pattern, a second gate insulation layer on the third channel layer pattern, and a second gate electrode on the second gate insulation layer.

9. The semiconductor device of claim 8, wherein the second channel layer pattern is between the first channel layer pattern and the third channel layer pattern, wherein the second gate insulation layer is between the third channel layer pattern and the second gate electrode, and wherein a conductivity level of the second channel layer pattern is lower than a conductivity level of the first channel layer pattern.

10. The semiconductor device of claim 8, wherein a conductivity level of the second channel layer pattern is also lower than a conductivity level of the third channel layer pattern.

11. A semiconductor device comprising:
a gate electrode on a substrate;
a gate insulation layer on the gate electrode;
a channel layer pattern on the gate insulation layer opposite the substrate;
metallic patterns that contact sidewalls of the channel layer pattern; and
an insulation layer that is directly on a surface of the channel layer pattern that is opposite the gate insulation layer, the insulation layer including a negative fixed oxide charge.

12. The semiconductor device of claim 11, wherein the insulation layer is also directly on at least some portions of the gate insulation layer.

13. The semiconductor device of claim 11, wherein the insulation layer comprises at least one material selected from the group consisting of aluminum oxide, hafnium oxide, zirconium oxide and lanthanum oxide.

14. The semiconductor device of claim 11, wherein the insulation layer is between the substrate and the channel layer pattern.

15. The semiconductor device of claim 11, wherein the channel layer pattern comprises a semiconductor oxide and/or a metal oxide.

* * * * *